Feb. 21, 1967 E. D. CHALMERS ETAL 3,305,784

UHF TELEVISION TUNER

Filed June 17, 1963

3 Sheets-Sheet 1

Inventors
Edward D. Chalmers
John Y. Ma
Joseph S. Maber
By Hofgren, Wegner, Allen, Stellman & McCord
Attorneys Feb. 21, 1967 E. D. CHALMERS ETAL 3,305,784

UHF TELEVISION TUNER

Filed June 17, 1963 3 Sheets-Sheet 2

Feb. 21, 1967 E. D. CHALMERS ETAL 3,305,784

UHF TELEVISION TUNER

Filed June 17, 1963

3 Sheets-Sheet 3

United States Patent Office 3,305,784

Patented Feb. 21, 1967

3,305,784
UHF TELEVISION TUNER

Edward D. Chalmers, Crystal Lake, John Y. Ma, Algonquin, and Joseph S. Naber, Marengo, Ill., assignors to Oak Electro/Netics Corp., a corporation of Delaware Filed June 17, 1963, Ser. No. 288,208
14 Claims. (Cl. 325—461)

This invention is concerned with a UHF tuner and more particularly with a UHF tuner for a television receiver.

The UHF television band, from 470 megacycles to 890 megacycles, is of increasing importance as available VHF channels are placed in use. At the present time, only one UHF television tuner is available commercially although others have been manufactured in the past and several different types are described in patents and publications. Present and past commercial tuners have utilized variable capacity tuning of the various circuits and generally have been rather large, expensive and difficult to align and calibrate.

A principal feature of the invention is the provision of a compact, UHF tuner using tunable inductors or line sections.

Another feature is that the tuner is contained in a conductive housing having a shield of conductive material dividing the housing into two compartments, with two tuned circuits in one compartment, coupled by the proximity of the tuned lines, and oscillator circuitry in the other compartment.

A further feature is that one end of each of the tuned lines is affixed to a wall of the housing and the other end of the line is mounted to a tuning capacitor carried by a wall of the housing.

Still another feature is that the two adjacent tuning lines, one for tuning the antenna or input circuitry and the other for tuning the mixer, have a conductive grounded shield element therebetween, the configuration of which affects the coupling between the circuits and the band width of the tuned coupling circuit.

A further feature is that the housing has a wall with a step therein defining two wall portions, with tuning capacitors mounted on each wall portion, one of the capacitors being connected with the end of the tuned line section and connected with the other by a conductor forming a fixed series inductor.

Another feature is that the tunable line is planar and mounted adjacent to and parallel with a grounded conductive member with an adjustable slider contact with a first portion of the line and the ground plane, the line having a second portion offset from the first and with a different spacing from the ground plane, providing a different characteristic impedance for the line at different frequencies.

Yet another feature is that the tuned lines are generally circular in configuration and are aligned, a single shaft carries adjustable contact members, one for each line, with means keying the shaft to the housing adjacent the oscillator line section to limit axial movement thereof.

And another feature is that the tuner includes a UHF transformer comprising a primary winding having a plurality of turns, a secondary winding having a plurality of turns wound in a self-supporting coil with the primary winding turns being around and supported by the secondary winding.

Yet a further feature is that the adjustable tuning contact comprises a double armed slider of resilient material having a U-shaped cross-section carried by a rotatable shaft extending generally at right angles to and coaxial with the line section.

Other objects and advantages will become readily apparent from the following description taken in connection with the accompanying drawings, in which.

Figures 1, 2, 3, 5, 7, 11:
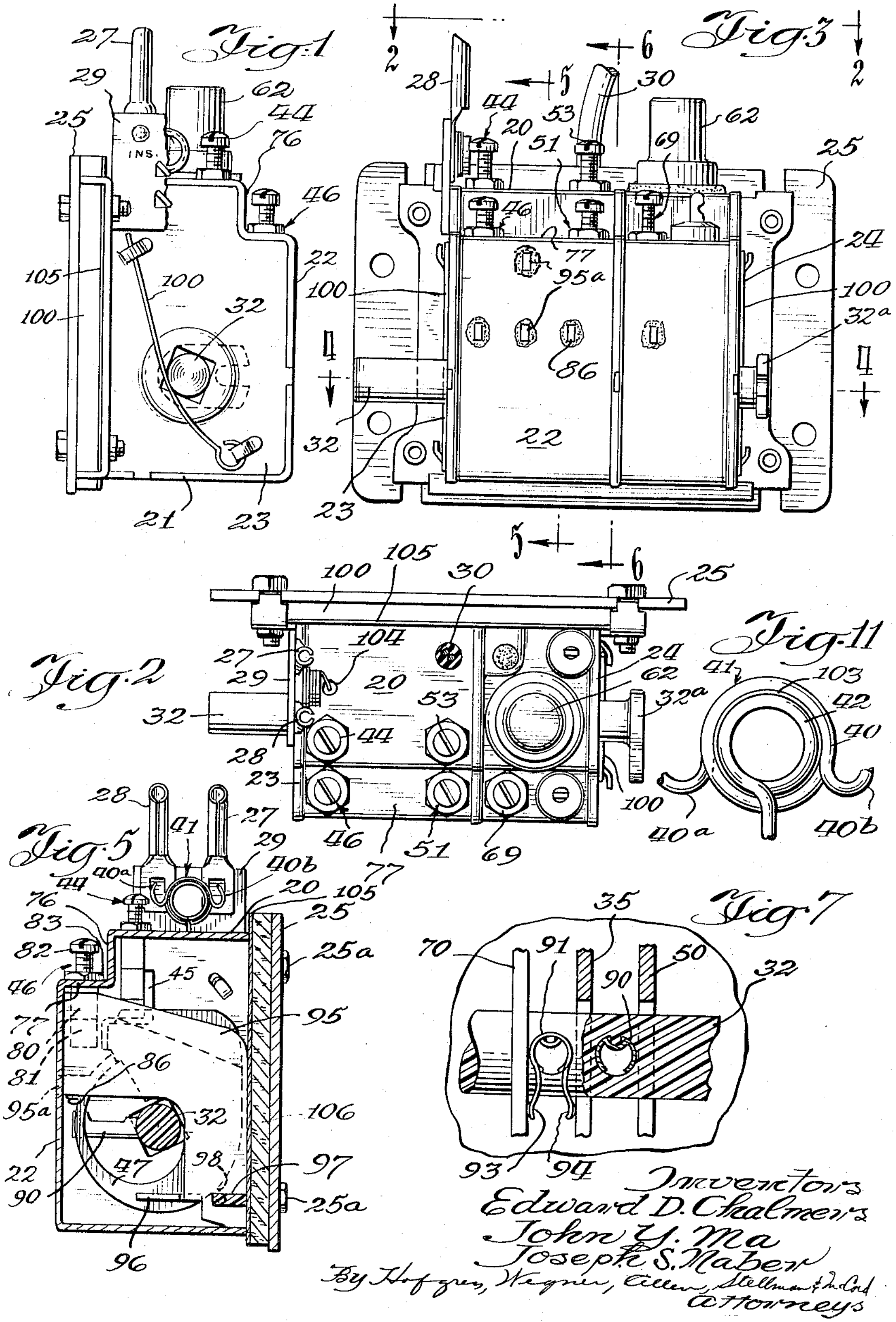
FIGURE 1 is an end view of a tuner embodying the invention having a portion broken away.
FIGURE 2 is a plan view thereof.
FIGURE 3 is a side view looking from the right of FIGURE 1.
FIGURE 5 is a vertical section taken generally along the line 5—5 of FIGURE 3.
FIGURE 7 is an enlarged fragmentary detail of the shaft and slider mounting.
Figures 8, 9, 10, 10A, 10B:
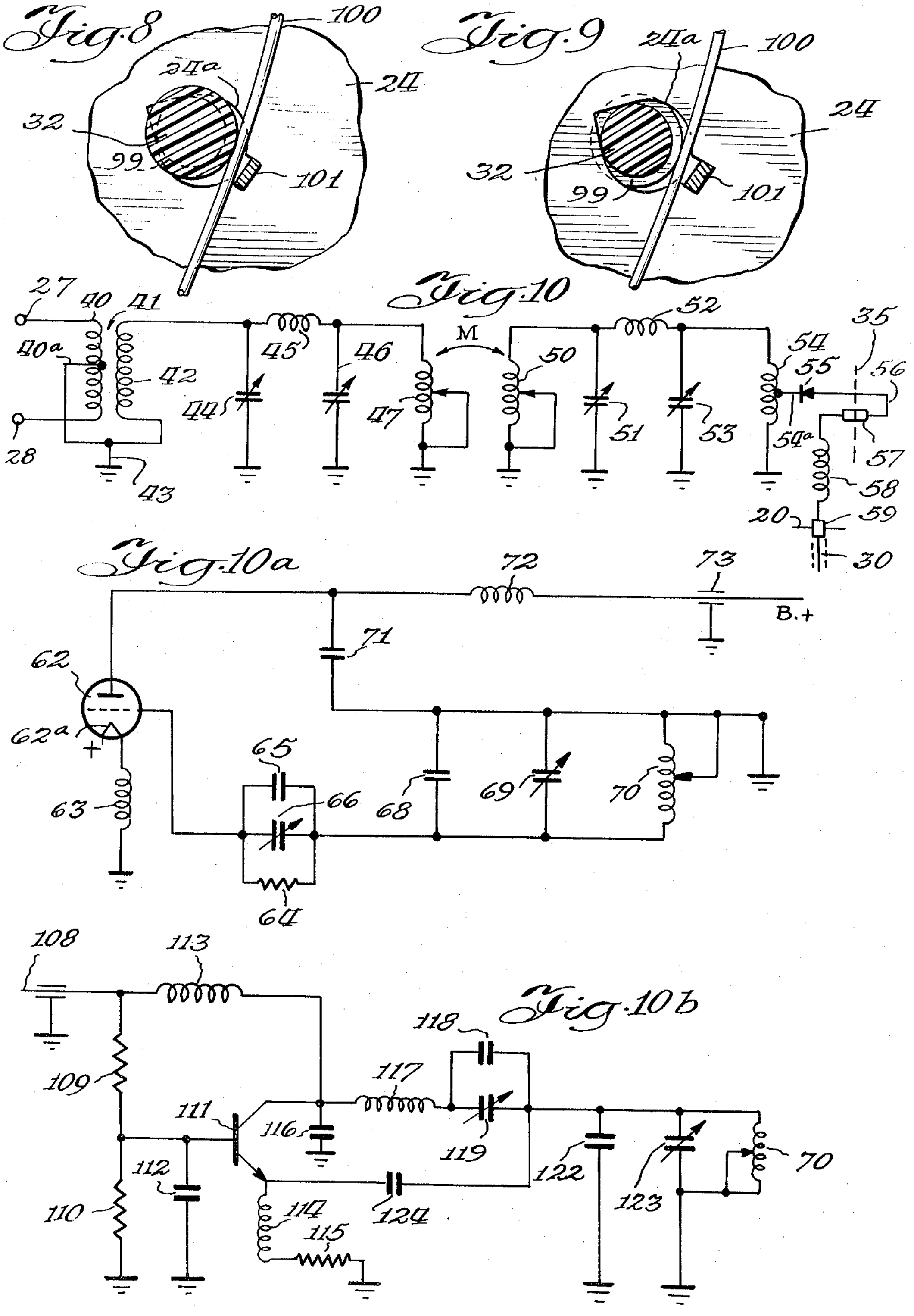
FIGURE 8 is an enlarged fragmentary view of the interlocked shaft mounting.
FIGURE 9 is a view similar to FIGURE 8 taken from the opposite side of the housing wall.
FIGURE 10 is a schematic diagram of the antenna and mixer circuitry of the tuner.

FIGURE 10*a* is a schematic diagram of an oscillator circuit for the tuner;

FIGURE 10*b* is a schematic diagram of a transistor oscillator circuit for the tuner; and FIGURE 11 is a side view of the step-up coupling transformer for the tuner.

While illustrative embodiments of the invention are shown in the drawings and will be described in detail herein, the invention is susceptible of embodiment in many different forms and it should be understood that the present disclosure is to be considered as an exemplification of the principles of the invention and is not intended to limit the invention to the embodiments illustrated. The scope of the invention will be pointed out in the appended claims.

In a UHF tuner for a television receiver, it is convenient to provide a local oscillator operating through a frequency range of the order of 41 megacycles greater than the frequency of the received signal. The output of the local oscillator is mixed with the incoming signal and the difference signal is coupled with the VHF tuner of the television receiver. The UHF band provides 70 television channels (channel 14–channel 83), each occupying a six megacycle band of the spectrum.

The tuner circuitry is located in a housing of conductive material which is generally box-like in shape. The housing has a top wall 20, bottom wall 21, side wall 22, and end walls 23 and 24. The side opposite side wall 22 is closed by a removable panel 25, which provides access to the interior of the tuner. A pair of antenna input terminals 27 and 28 are mounted on a board 29 of insulating material carried at the top of housing end member 23. The lead-in (not shown), as a 300 ohm two-wire line from a suitable UHF antenna, may be connected with the terminals. A shielded output cable 30 connects the output signal of the tuner with further circuitry, as the VHF tuner of a television receiver (not shown). A tuning shaft 32 extends longitudinally through the housing and cooperates with the internal circuitry to control the frequency of operation of the tuner, as will appear. A slotted eccentric flange **32*a*** at one end of the shaft provides for a driving connection with a suitable manual or motor operated tuning mechanism (not shown).

Figure 6:
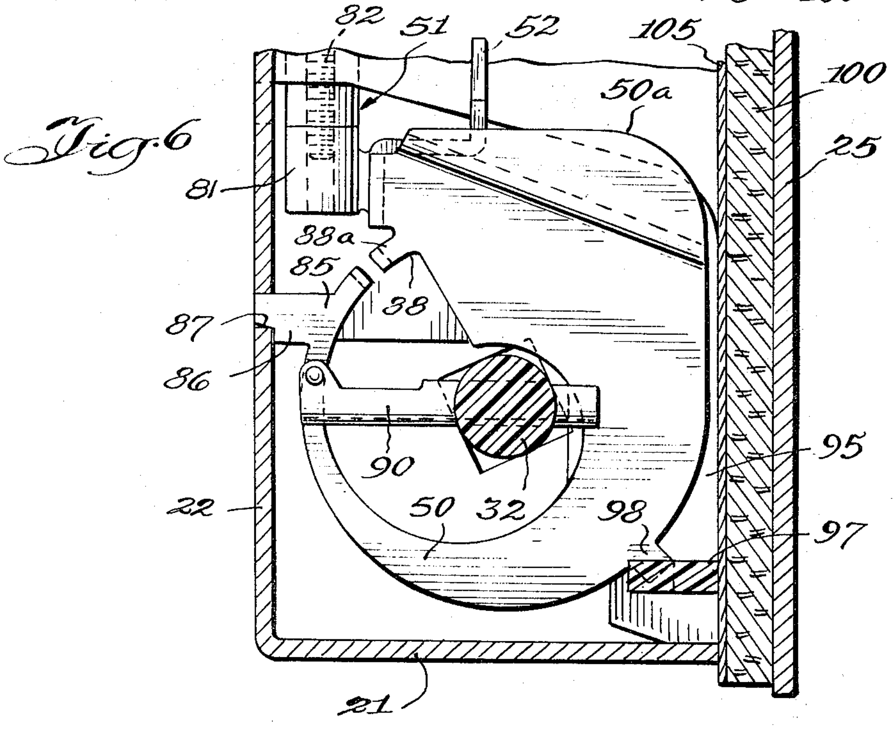
FIGURE 6 is an enlarged vertical section taken generally along line 6—6 of FIGURE 3.

The interior of the housing (FIGURES 4, 5 and 6) is divided by a shield plate 35 into two compartments 36 and 37. Compartment 36 contains the antenna tuning circuitry and a major portion of the mixer circuitry, while compartment 37 contains the oscillator circuitry and means for coupling with the mixer.

Before proceeding with a detailed discussion of the mechanical construction of the tuner, the circuit (FIGURE 10) will be described. In FIGURE 10, the antenna tuning and mixer circuitry are shown. Antenna terminals 27 and 28 are connected with the primary winding 40*a* of antenna transformer 41. A center tap 40*a* of the primary winding is returned to a reference potential or ground 43, in this case the conductive housing of the tuner. Transformer secondary winding 42 has one terminal connected with ground. The signal appearing at the other terminal of the transformer secondary winding 42 is coupled with a tuned circuit including variable shunt capacitor 44, series inductor 45, variable shunt capacitor 46, and a variable inductor 47.

The mixer circuitry includes a variable inductor 50 coupled with variable inductor 47 as will appear, variable shunt capacitor 51, series inductor 52 and second variable shunt capacitor 53. The signal from the mixer tuned circuit is developed across inductor 54, which is returned to ground. A crystal diode mixer 55 is connected to an intermediate tap 54*a* of inductor 54, for proper impedance match, preferably determined by the maximum signal-to-noise ratio. Mixer 55 is connected with a coupling loop 56 which extends through shield 35 into oscillator compartment 37 of the tuner housing. This loop is inductively coupled with the components of the oscillator to provide sufficient oscillator energy to mix with the incoming signal. The coupling loop 56 is a single conductor which also provides the output connection for the mixer. It extends through a feed-through capacitor 57 mounted in shield 35, an RF choke 58, located in housing compartment 36, and a second feed-through capacitor 59, mounted in the wall 20 of the housing, to output cable 30. Feed-through capacitors 57, 59 and choke 58, form a low pass filter which attenuates the incoming signal and oscillator frequencies while passing the desired difference frequency.

The antenna and mixer tuned circuits provide for calibration or tuning at each end of the frequency band covered by the tuner. At the low frequency end, 470 megacycles, all of the variable inductors 47, 50 are in the circuit and tuning is accomplished by varying capacitors 46, 51. At the high end of the band, the inductors 47, 50 are substantially shorted, reducing the effectiveness of capacitors 46, 51; and the tuned circuits are calibrated by adjusting capacitors 44, 53.

In FIGURE 10*a*, a triode oscillator circuit for the tuner is illustrated. The oscillator utilizes a UHF triode, as a type 6DS4. The oscillator illustrated is basically a common plate Colpitts circuit. Oscillator tube 62 has directly heated filament 62*a*, one terminal of which is connected with a suitable source of power with the other terminal returned to ground through an RF choke 63. The grid circuit of the tube includes a resistor 64 shunted by a temperature compensating capacitor 65 and trimmer capacitor 66. The tuned circuit for the oscillator is made up primarily of a temperature compensating capacitor 68 connected from the resistor 64 to ground and shunted by a trimmer capacitor 69 and variable tuning inductor 70. The plate is returned to ground by a capacitor 71 and is connected through an RF choke 72 and bypass capacitor 73 with a suitable B+ operating potential.

The variable tuning inductors for the antenna, mixer and oscillator circuits are generally circular or ring-like conductors which may be considered to operate as inductors at UHF frequencies. The configuration of mixer inductor 50 is clearly shown in FIGURE 6. The antenna tuning inductor 47 is identical and the configuration of the oscillator inductor 70 differs only slightly due to the slight difference in operating range of the oscillator. The maximum effective length of the inductor is approximately 1/12 of a wave length at 470 megacycles. At this wave length the calculated reactance of the inductor is substantially the same whether it is considered as a lumped constant inductance or as an inductive transmission line element of distributed constants. The remainder of the resonant circuit elements (trimmer capacitors and fixed inductors) and stray capacity and inductance combine with the adjustable inductors to provide equivalent quarter wave tuned circuits.

The top wall 20 of the tuner housing has a vertical step 76 formed therein, there being an offset top wall portion 77 below and to one side of the major surface 20 of the top wall. Tuning capacitors 46, 51 and 69, which are connected directly across the variable inductors 47, 50 and 70, are mounted on shelf 77. Capacitor 46, shown in detail in FIGURE 5, is representative. The capacitor comprises a cylindrical dielectric body 80 having a conductive outer surface portion 81 at the lower end thereof and having a threaded bore in which an adjustment screw 82 is received. A nut 83 on screw 82 holds the capacitor against mounting wall 77 and completes the electrical circuit to the screw. The position of screw 82 determines the capacity between conductive surface 81 and the housing. High frequency trimmer capacitors 44 and 53 are similarly mounted in top wall portion 20.

Each of the tuned inductive lines 47, 50 and 70 is mounted in substantially the same manner adjacent a generally planar ground surface and it is tuned by varying the position of a grounding slider, as will appear. Mixer tuned line 50 (shown in FIGURE 6) has a terminal end portion 85 provided with an outwardly extending mounting tab 86 received in an opening 87 of wall 22 of the housing. The line section is generally circular in configuration, but of varying radial width. The end portion 88, opposite end 85, is secured to the conductive capacitor plate 81 of trimmer capacitor 51. Tuning shaft 32 carries a grounding slider 90 which has an end portion that moves along the inductor as the shaft is rotated, and connects the inductor with the conductive wall of the housing. With slider 90 at end portion 85 of the inductor, all of the inductor is in the circuit which is tuned to operate at its lowest frequency. With the slider at end portion 88, substantially all of the variable inductor is shorted and the circuit is tuned for its highest frequency. Approximately 330° of the inductor form the active tuned circuit. The tuning shaft 32 and sliders 90 are capable of 360° rotation. Stub surfaces 85*a* and 88*a* extend from the terminal portions 85 and 88 toward each other, on the circular track of slider 90. These extensions do not touch each other, but the ends thereof are formed outwardly away from the plane of the slider, to permit the slider to move from one extension to the other, regardless of the direction of rotation of the tuning shaft. The variation of the radial dimension of the inductor along the length thereof provides a generally straight line frequency-angular displacement tuning characteristic.

A portion 50*a* of inductor 50 is offset from the plane of the inductor toward the adjacent ground plane (here internal housing shield 35, FIGURE 4) to provide a lower characteristic operating impedance for the inductor in the high frequency portion of its operating range than in the low frequency portion of the range.

The high frequency adjustment capacitors 44 and 53 are mounted from the top wall portion 20 of the housing in the same manner as capacitor 46 is mounted. The fixed series inductor, as 45 of the antenna tuning circuit, comprises a strip of conductive material having one end connected with the conductive surface area of capacitor 46 and the other end connected with the corresponding conductive surface area of capacitor 44, extending downwardly from housing wall 20. Conductor 45 has a generally L-shaped configuration paralleling the wall portion 77 and vertical step 76.

Figure 4:
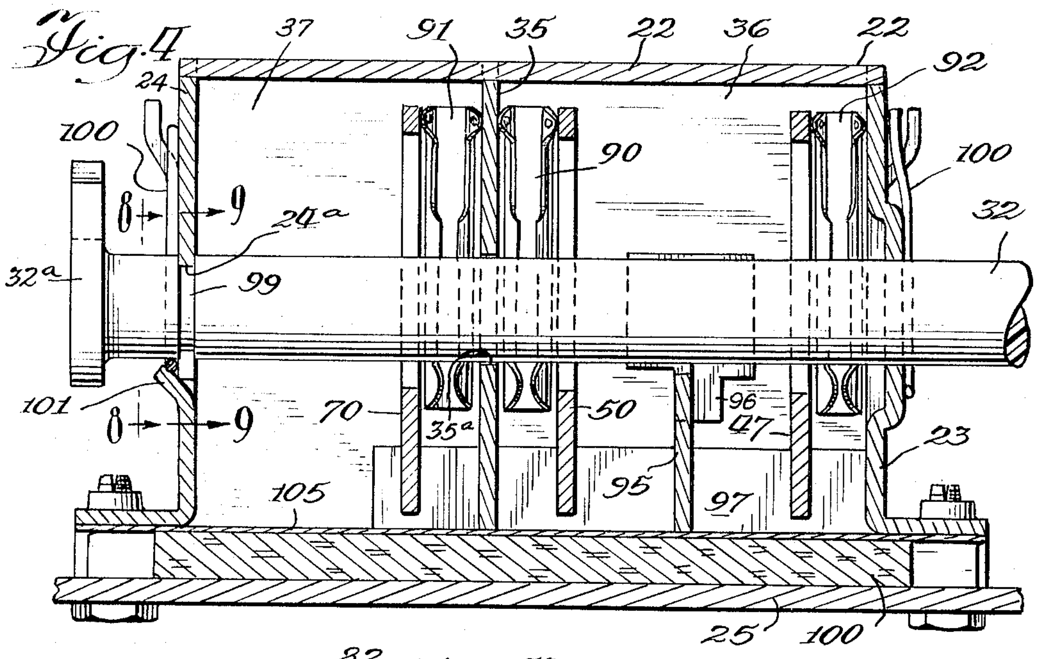
FIGURE 4 is an enlarged transverse section taken generally along line 4—4 of FIGURE 3.

As best seen in FIGURE 4, variable inductors 47, 50 and 70 are mounted in generally parallel and aligned relationship in the housing. Antenna tuning inductor 47 is adjacent end wall 23, mixer tuning inductor 50 is adjacent shield 35 and in compartment 36 with the antenna inductor, while oscillator tuning inductor 70 is adjacent shield 35, in compartment 37. Shaft 32 is carried in bearing openings in housing end walls 23 and 24, as will appear, and extends through an opening 35a in shield 35. Tuning shaft 32 is of a suitable insulating material, as a molded, glass filled nylon. Shorting sliders 90, 91 and 92 are located between the respective inductor lines and the adjacent, parallel, planar grounded conductive surfaces. The sliders extend radially outwardly from tuning shaft 32 and are of a resilient conductive material. The sliders are generally U-shaped in cross-section (FIGURE 7) with contact surfaces 93 and 94 bearing on the inductor and adjacent ground surface. The sliders 90, 91 and 92 lie in the same radial plane extending outwardly from the shaft.

Variable inductors 47 and 50 of the antenna and mixer circuits have mutual coupling due to their proximity in compartment 36. The degree of coupling between the inductors for various frequencies of operation of the tuner is controlled by a conductive shield element 95 which has tab portions 95a mounted in housing wall 22, and extends between the two inductors throughout approximately 270° of their extent. The major portion of shield 95 is a planar element parallel with the inductors throughout the high frequency portion. At the low frequency end of the shield, a further portion 96 is provided, at right angles to the plane of the major portion of the shield. Portion 96 provides a lesser shielding effect than the remainder of the shield, and has a configuration which may readily be modified without a major modification of the tools on which it is made. This permits the coupling between the lines to be altered without disrupting the manufacturing procedure.

A spacer 97 of insulating material is carried by shield 35, the spacer having a slot therein which engages corresponding slot in the shield. Additional slots are provided in the spacer 97 to receive tab portions as 98 (FIGURE 6) of the variable inductors, stabilizing their position within the housing.

The operating stability of the tuner is dependent primarily on the stability of the oscillator. In order to reduce variations in the oscillator frequency which might result from changes in mechanical position of the slider 91 and oscillator tuning inductor 70, the shaft 32 is keyed with the housing, adjacent the oscillator compartment. Shaft 32 has a channel 99 (FIGURE 4) therein of substantially the same width as the thickness of housing end wall 24. The edge 24a of the end wall is received in the channel, locking the shaft 32 against longitudinal movement. The opening in housing wall 24 has two straight edges extending at right angles, and forming two sides of the opening. The remainder of the opening has a generally circular configuration. Shaft 32 is urged into the straight edged portion of the opening by a retainer spring 100. A tab 101 extends outwardly adjacent retainer spring 100, preventing the spring from being deflected far enough to move the tuning shaft out of axially interlocked engagement with the edge 24a of the opening.

The antenna input terminals 27 and 28 are connected with the antenna tuning circuit through a step-up coupling transformer, the physical nature of which is best illustrated in FIGURE 11. Secondary winding 42 comprises several turns as six turns, wound in a self-supporting coil. A layer of adhesive tape is wound over the secondary coil and serves to hold the turns in place. The primary winding 40, which may comprise two turns, is wound over the tape 103. The transformer 41 is located immediately adjacent the bottom ends of terminals 27 and 28 to limit the length of primary winding leads 40a and 40b. The grounded terminal of secondary winding 42 is connected with the center tab of the primary winding and the two are connected directly with the chassis housing immediately beneath the transformer. The other terminal of the secondary winding extends downwardly through an opening 104 in the top wall 20 of the housing and is connected with the conductive surface of variable capacitor 44. All of the connections are as short as possible.

It is important to the electrical characteristics of the tuner that the cover plate 25 has good electrical contact with the walls of the housing, the interior shield 35 and the shield 95 between the antenna and the mixer inductors. In the tuner illustrated herein, this is accomplished by mounting a flexible conductive sheet 105 on a resilient block 106, which may be of cork, on the inner surface of plate 25. The resilience of the cork of the flexibility of sheet 105 insures that the side of the tuner housing is completely closed and that electrical continuity is maintained throughout the housing. Closure plate 25 is held in place by suitable screws 25a.

FIGURE 10b shows a transistor oscillator circuit which may be substituted for the triode circuit of FIGURE 10a. The oscillator utilizes a Fairchild SE3001 transistor connected in a grounded base oscillator circuit. A 12 volt operating supply (not shown) is connected with terminal 108 and across a voltage divider to ground, including resistor 109, 3300 ohms, and resistor 110, 2700 ohms. The base of the transistor 111 is connected with the junction of the two resistors and is grounded at the operating frequency by capacitor 112, 30 pf. The 12 volt supply is connected with the collector of the transistor through choke 113. The emitter is connected with ground through choke 114 and bias resistor 115, 330 ohms. Capacitor 116, 6.8 pf., is connected from the collector to ground, providing a uniform capacitive load for the transistor.

The collector is tuned by a circuit including a series inductor 117 connected with the parallel combination of temperature compensating capacitor 118 and adjustable trimmer capacitor 119. The oscillator tuning inductor 70 is connected from capacitors 118, 119 to ground and is shunted by the parallel combination of temperature compensating capacitor 122 and trimmer capacitor 123. A feedback capacitor 124, 0.3 pf., is connected from the emitter to the junction between capacitors 118, 119 and inductor 70.

The frequency of the oscillator at the low end of the UHF band is adjusted by trimmer capacitor 123. The frequency at the high end of the band is adjusted by trimmer capacitor 119.

We claim:

1. A UHF tuner, comprising: a housing of conductive material; a shield in said housing dividing the interior thereof into two compartments; input terminals for connection with an antenna circuit; a first tunable line in one of said compartments and connected with said input terminals for tuning the antenna circuit; a mixer circuit having a portion in each of said compartments and including a second tunable line in said one compartment and in coupled relation with said first tunable line; an oscillator circuit including a third tunable line in said other compartment, said mixer circuit portion in said other compartment being in coupled relation with said oscillator circuit; an output terminal connected with said mixer circuit; and means for tuning said lines.

2. The tuner of claim 1 in which said first and second tunable lines are generally parallel and aligned.

3. The UHF tuner of claim 2 having a conductive shield element connected with said housing and extending between portions of said first and second lines.

4. The tuner of claim 3 wherein said shield element includes a conductive plate extending between portions of said first and second lines and electrically connected with the housing for said tuner.

5. The tuner of claim 4 wherein said shield plate has a main body portion generally parallel with said first and second lines and another portion extending generally at right angles to said main body portion.

6. A UHF tuner, comprising: a housing of conductive material, having generally parallel end walls joined by side walls; a shield of conductive material extending across said housing, generally parallel with said end walls and in electrical contact with said side walls, said shield plate dividing said housing into two compartments; a pair of input terminals for connection with an antenna circuit; a first tunable line in one of said compartments having one end connected with said housing and the other end connected with said input terminal, said line being parallel with a grounded planar surface of said housing; adjustable shorting means connected between said line and said housing surface; a mixer circuit having a portion in each of said compartments and including a second tunable line in said one compartment and in coupled relation with said first line, said second line having one end connected with said housing and the other end connected with said mixer circuit, said second line being parallel with a grounded planar surface of said housing; adjustable shorting means connected between said second tunable line and the adjacent housing surface; an oscillator circuit including a tunable third line in said other compartment, said third tunable line having one end connected with said housing and the other end connected with said oscillator circuit, said third line being parallel with a grounded planar surface of said housing, said mixer circuit having a portion in coupled relation with said oscillator circuit; adjustable shorting means connected between said third tunable line and the adjacent housing surface; an outlet terminal connected with said mixer circuit; and means for adjusting said shorting means.

7. The tuner of claim 6 wherein said housing has a removable wall portion, said removable wall including a conductive sheet mounted on a resilient base for intimate physical contact with adjacent edges of the housing.

8. A double tuned ultra high frequency tuned circuit, comprising: a housing of conductive material having a plurality of walls, one wall having portions forming a step therein, dividing the wall into two portions; a pair of variable capacitors, one mounted on each of said wall portions; a tuned line having one end portion secured to a wall of said housing and another end portion secured to one of said capacitors; means for varying the effective length of said line; and a conductor connected from one of said capacitors to the other forming a fixed inductor in series with said line.

9. A tuned ultra high frequency tuned circuit, comprising: a housing of conductive material having a top wall and a side wall extending downwardly therefrom; a variable capacitor mounted on said top wall and having a terminal portion extending downwardly therefrom within said housing, and an adjusting element accessible above said top wall; an arcuate tuned line having one end portion secured to the downwardly extending wall of said housing and another end portion secured to said capacitor terminal portion; and means for varying the effective length of said line.

10. The tuner of claim 8 in which said conductor has portions generally parallel with the step configuration portions of said capacitor mounting wall.

11. In a UHF tuner having a housing of conductive material, a plurality of tunable lines in said housing, said lines having a generally circular configuration, each being parallel with an adjacent wall of said housing, a rotatable shaft extending through said housing generally concentric with said tuned lines, contact members carried by said shaft between each line and the wall adjacent thereto, contacting the line and the wall, for varying the effective length of said lines, a mixer circuit connected with one of said lines; a heterodyne tuning oscillator connected with another of said lines; means coupling said oscillator and mixer circuits, an output terminal connected with said mixer circuit, the improvement comprising means keying said shaft with said housing, limiting axial movement of the shaft, said keying means being closer to the line connected with said oscillator than to the line connected with said mixer.

12. The tuner of claim 11 wherein said shaft extends through an opening in a wall of said housing, said shaft having a slot therein in which a portion of the wall is received, with spring means urging said shaft against the edge of the opening in the wall, keying the shaft to the housing.

13. A UHF tuned line, comprising: a tunable conductive line of generally arcuate configuration with end portions adjacent but spaced from each other; a source of signal; means defining a signal reference with respect to said source and including a planar conductive sheet parallel with and closely adjacent said conductive line, one end terminal of said line being connected with said reference means; means connecting said source of signal with the other terminal of said line; and a shorting member between said line and reference sheet, and rotatable along the line to vary the effective length thereof, the adjacent end portions of said line being angled axially away from said shorting member.

14. The tuned circuit of claim 13 including a shaft extending generally at right angles to the plane of said line and through the center thereof, said shaft carrying a radially extending double armed shorting member of resilient conductive material.

References Cited by the Examiner

UNITED STATES PATENTS

| | | | |
|---|---|---|---|
| 2,763,776 | 9/1956 | Bussard et al. | 325—439 |
| 3,154,755 | 10/1964 | Wegener | 334—43 |

References Cited by the Applicant

UNITED STATES PATENTS

| | | |
|---|---|---|
| 2,513,392 | 7/1950 | Aust. |
| 2,513,393 | 7/1950 | Frey et al. |
| 2,693,581 | 11/1954 | Osborn. |
| 2,759,158 | 8/1956 | Puerner. |
| 2,778,943 | 1/1957 | Blonder. |

KATHLEEN H. CLAFFY, *Primary Examiner.*

R. LINN, *Assistant Examiner.*